United States Patent
Kuo et al.

(10) Patent No.: US 8,656,319 B2
(45) Date of Patent: Feb. 18, 2014

(54) OPTICAL PROXIMITY CORRECTION CONVERGENCE CONTROL

(75) Inventors: Cheng-Cheng Kuo, Baoshan Township, Hsinchu County (TW); Ching-Che Tsai, Zhubei (TW); Tzu-Chun Lo, New Taipei (TW); Chih-Wei Hsu, Zhubei (TW); Hua-Tai Lin, Hsinchu (TW); Tsai-Sheng Gau, Hsinchu (TW); Wen-Chun Huang, Tainan (TW); Chih-Shiang Chou, Pingzhen (TW); Hsin-Chang Lee, Hsin-Chu Xian (TW); Kuei Shun Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/368,919

(22) Filed: Feb. 8, 2012

(65) Prior Publication Data

US 2013/0205265 A1 Aug. 8, 2013

(51) Int. Cl.
*G06F 17/50* (2006.01)

(52) U.S. Cl.
USPC .................................. 716/53; 716/51; 716/50

(58) Field of Classification Search
None
See application file for complete search history.

(56) References Cited

U.S. PATENT DOCUMENTS

| | | | | |
|---|---|---|---|---|
| 6,846,595 B2* | 1/2005 | Smith | | 430/5 |
| 6,928,634 B2* | 8/2005 | Granik et al. | | 716/52 |
| 6,934,007 B2* | 8/2005 | Fritze et al. | | 355/53 |
| 7,065,738 B1* | 6/2006 | Kim | | 716/53 |
| 7,266,803 B2* | 9/2007 | Chou et al. | | 716/51 |
| 7,568,179 B1* | 7/2009 | Kroyan et al. | | 716/51 |
| 7,749,662 B2* | 7/2010 | Matthew et al. | | 430/5 |
| 2007/0028206 A1* | 2/2007 | Chou et al. | | 716/21 |
| 2011/0271238 A1* | 11/2011 | Mansfield et al. | | 716/55 |

* cited by examiner

*Primary Examiner* — A. M. Thompson
(74) *Attorney, Agent, or Firm* — Haynes and Boone, LLP

(57) ABSTRACT

A method of optical proximity correction (OPC) convergence control that includes providing a lithography system having a photomask and an illuminator. The method further includes performing an exposure by the illuminator on the photomask. Also, the method includes optimizing an optical illuminator setting for the lithography system with a defined gate pitch in a first direction in a first template. Additionally, the method includes determining OPC correctors to converge the OPC results with a target edge placement error (EPE) to produce a first OPC setting for the first template. The first OPC setting targets a relatively small EPE and mask error enhancement factor (MEEF) of the defined gate pitch in the first template. In addition, the method includes checking the first OPC setting for a relatively small EPE, MEEF and DOM consistency with the first template of the defined gate pitch in a second, adjacent template.

20 Claims, 5 Drawing Sheets

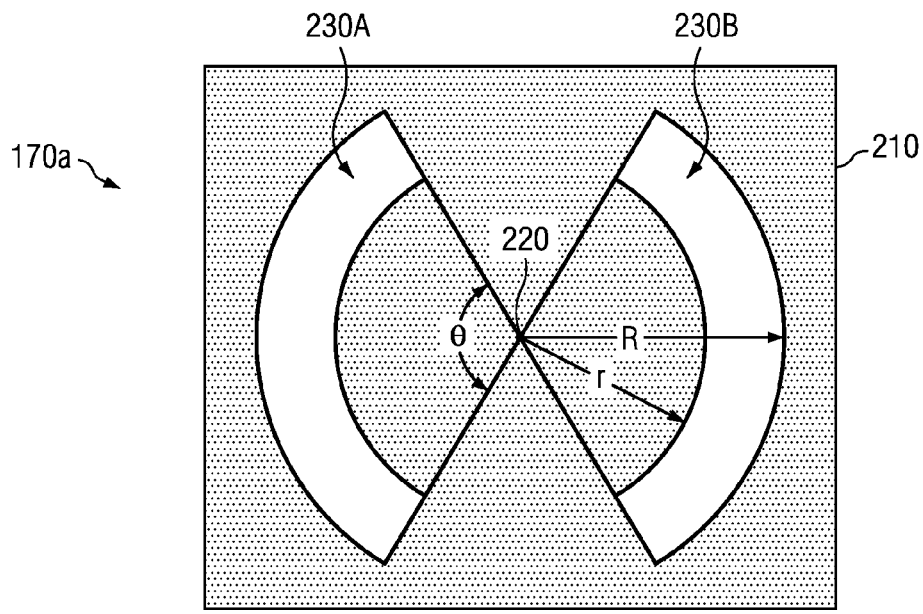
*Fig. 2a*
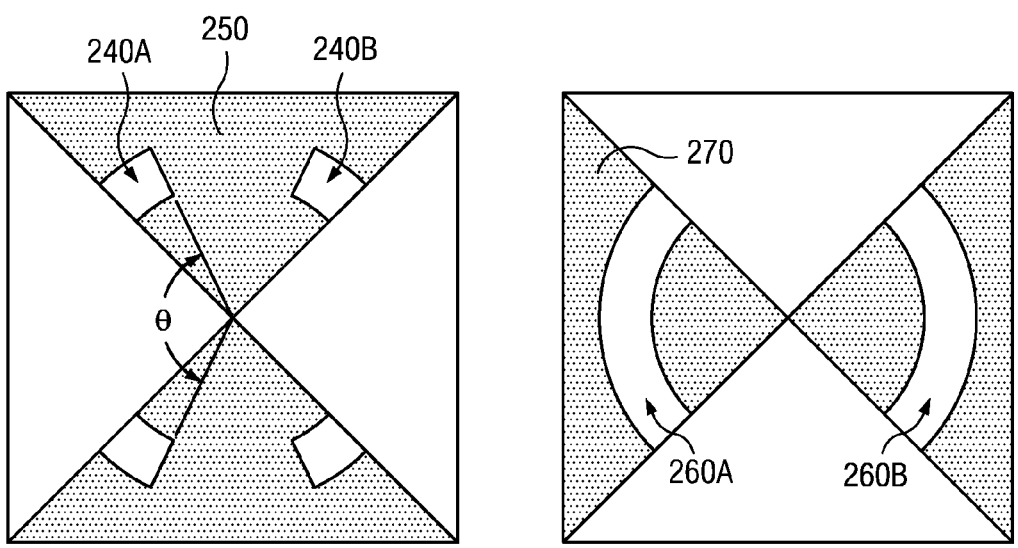
*Fig. 2b*  *Fig. 2c*

OPTICAL PROXIMITY CORRECTION CONVERGENCE CONTROL

BACKGROUND

Semiconductor integrated circuit (IC) technology has experienced rapid progress including the continued minimization of feature sizes and the maximization of packing density. The minimization of feature size relies on improvements in photolithography and its ability to print smaller features or critical dimensions (CD). However, a photomask used in photolithography may suffer an angle-dependent CD difference, in which pattern features such as lines may have different widths when disposed from different directions.

Optical proximity correction (OPC) is a technique used in photolithography to compensate for image errors that occur during the lithography process. OPC often has problems in not being able to converge similar dimensions of mask (DOM) in adjacent mask templates. Efforts to improve OPC consistency in adjacent templates often occur at the expense of OPC consistency in individual templates.

It is desired to improve OPC convergence and consistency, as well as achieving a low mask error enhancement factor (MEEF), a low edge placement error (EPE) and good CD uniformity.

SUMMARY

The present disclosure describes a novel lithography system and components thereof, as well as a novel method for use in such a system. In one embodiment, a method for use in a lithography system including an optical illuminator with first and second adjacent templates, includes performing an exposure using the illuminator and a photomask and optimizing an optical illuminator setting based, at least in part, on one or more of a numerical aperture, a sigma-in, a sigma-out, and a wave phase for the photomask with a defined gate pitch in a first direction in the first template. One or more optical proximity correction (OPC) correctors are determined to converge OPC results with a target edge placement error (EPE) to produce a first OPC setting for the first template, wherein the first OPC setting targets a relatively small EPE and mask error enhancement factor (MEEF) of the defined gate pitch in the first template. The method then checks the first OPC setting for a relatively small EPE and a relatively small MEEF of the defined gate pitch in the first direction in the second template.

In another embodiment, a method for use in a lithography system including a mask with a less than 2% transmission rate of the opaque region and an X-Y asymmetric illuminator with a larger than 3% filling ratio off-set (FRO), is disclosed. The method includes performing a single exposure by the X-Y asymmetric illuminator on the mask and optimizing an optical illuminator settings for the lithography system based, at least in part, on one or more of a numerical aperture, a sigma-in, a sigma-out, and a wave phase for the mask with a defined gate pitch in a first direction in a first template of the X-Y asymmetric illuminator. Optical proximity correction (OPC) results for the mask are determined, and OPC correctors are determined to converge the OPC results with a target edge placement error (EPE) and a mask error enhancement factor (MEEF) to produce a first OPC setting for the first template. The first OPC setting targets a relatively small EPE and MEEF of a defined gate pitch in the first template. The method further includes checking the first OPC setting for a relatively small EPE and MEEF of the defined gate pitch in a second, adjacent template of the X-Y asymmetric illuminator.

In another embodiment, a method includes receiving a mask with less than 2% transmission rate of an opaque region and asymmetric design rules and providing the mask to an lithography system including with an X-Y asymmetric illuminator with a larger than 3% filling ratio off-set. The method also includes performing a single exposure by the lithography system using the X-Y asymmetric illuminator on the mask and optimizing an optical illuminator settings for the lithography system based, at least in part, on one or more of a numerical aperture, a sigma-in, a sigma-out, and a wave phase for the mask with a defined gate pitch in a first direction in a first template. The method further includes determining optical proximity correction (OPC) correctors to converge the OPC results with a target edge placement error (EPE) and a mask error enhancement factor (MEEF) to produce a first OPC setting for the first template. The method also includes checking the first OPC setting for a relatively small EPE and MEEF of a defined gate pitch in a second, adjacent template, and making a second OPC setting if the first OPC setting does not achieve convergent results in the second, adjacent template. The second OPC setting results a relatively small EPE and MEEF in the first template. The method further includes checking the second OPC setting in the second, adjacent template, for a relatively small EPE and MEEF.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2a is a side perspective view of an embodiment of an illuminator, which can be integrated into the lithography system of FIG. 1.

FIGS. 2b and 2c are schematic views of filling ratio of X-Part and Y-Part of the illuminator of the embodiment in FIG. 2a, which can be integrated into the lithography system of FIG. 1.

DETAILED DESCRIPTION

Figure 1:
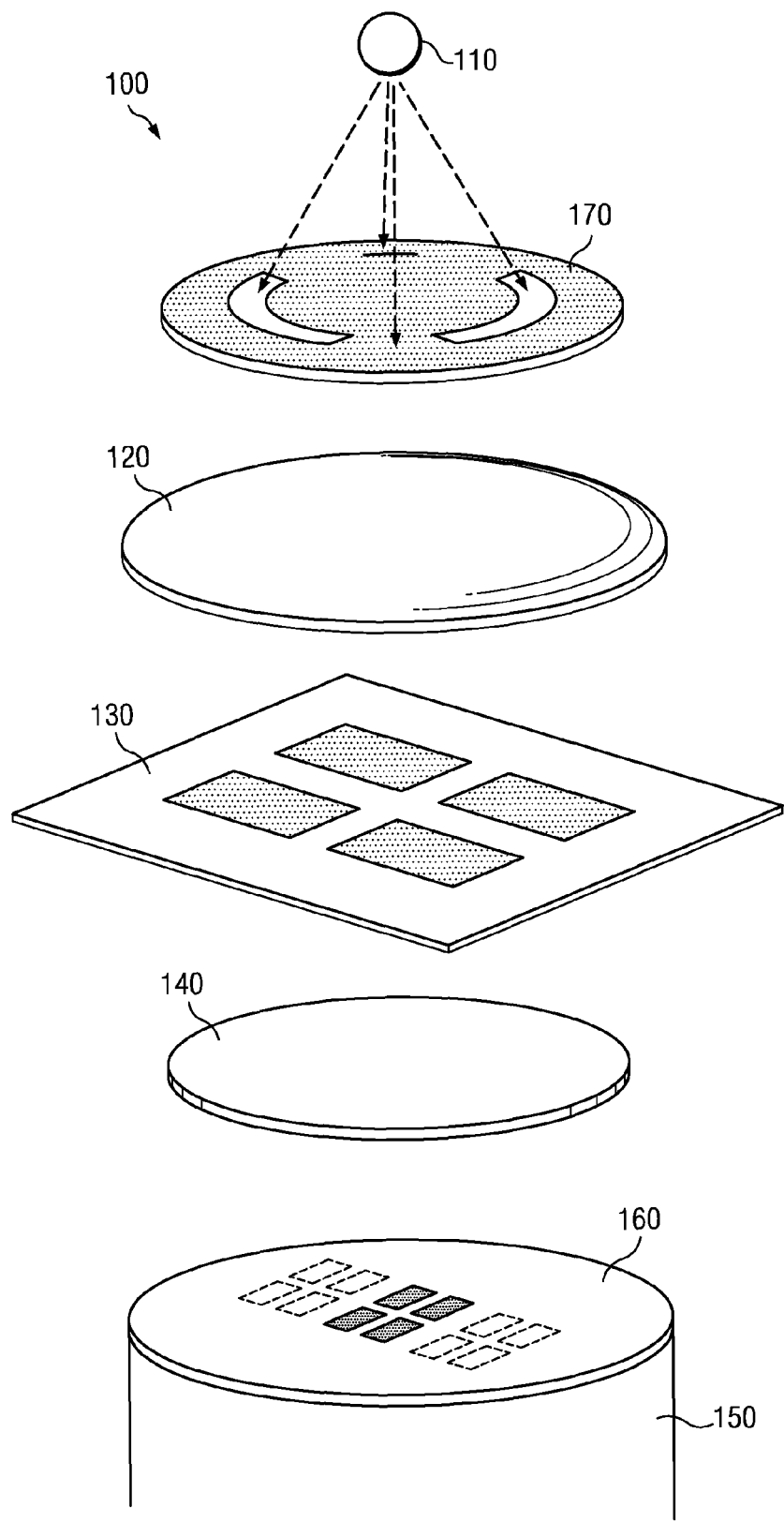
FIG. 1 is a schematic view of an exemplary embodiment of a lithography system capable of compensation illumination.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 describes an embodiment of a lithography system 100 that may benefit from one or more embodiments of the present invention. The lithography system 100 includes a radiation source (or source) 110. The radiation source 110 may be any suitable light source, such as a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). The radiation source 110 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The lithography system 100 also includes an illumination system 120. The illumination system 120 may comprise refractive optics, such as a single lens or a lens system having multiple lenses and reflective optics, such as mirrors. For example, the illumination system 120 may include microlens arrays, shadow masks, and/or other structures designed to aid in directing light from the light source 110 onto a photomask.

The lithography system 100 receives and uses a photomask (also referred to as a mask or a reticle) 130. The mask 130 can be a transparent mask or a reflective mask. A transparent mask includes a transparent substrate and a patterned absorption layer. A light beam may be partially or completely blocked when directed on an absorption region. The absorption layer may be patterned to have one or more openings through which a light beam may travel through (for a transparent mask) or reflect from a reflective region (for a reflective mask). The mask 130 may incorporate other resolution enhancement techniques such as phase shift mask (PSM) and/or optical proximity correction (OPC), which will be described in further detail later below.

The lithography system 100 also includes a projection system 140. The projection system 140 may have refractive optics or reflective optics. The projection system 140 directs the patterned radiation to a target.

The lithography system 100 may further include a substrate stage 150 capable of securing and moving a target substrate 160 in translational and rotational modes such that the substrate may be aligned with the photomask 130. The target substrate 160 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The target substrate 160 may also have a photoresist coating layer formed thereon during the lithography process.

The lithography system 100 also includes an illuminator 170 having a plurality of radiation-transmitting regions (or illumination poles) to transmit radiation energy from the radiation source 110. The illuminator 170 may be positioned between the radiation source 110 and the illumination system 120 in the lithography system 100. The plurality of radiation-transmitting regions of the illuminator 170 is defined along radial axis perpendicular to the optical axis. Each radiation-transmitting region is designed to transmit radiation with an adjustable intensity and is operable to provide asymmetric illumination.

Additionally or alternatively, each radiation-transmitting region of the illuminator 170 may be designed to transmit radiation with an adjustable phase (radiation wave phase), polarization (radiation wave polarization), or combinations thereof. Each radiation-transmitting region of the illuminator 170 may be designed to be in various shapes, sizes, and/or be disposed away from the optical axis for off-axis illumination. The plurality of radiation-transmitting regions of the illuminator 170 may be designed to be separate from each other or contacting each other to form a continuous area.

The plurality of radiation-transmitting regions of the illuminator 170 may be further designed to have various radiation intensities, radiation wave phases (such as optical phase), radiation polarizations (such as optical polarization), or combinations thereof utilized by various methods and materials including but not limited to: glass with a tunable tilt angle; multicoated glass with predefined transmittance; two optical polarizers stacked with a specific angle between polarizing directions thereof; liquid crystal sandwiched between two polarizers (parallel or orthogonal) controllable to tune intensity, phase, polarization, or combinations thereof when properly integrated with electrodes; or controllable radiation-blocking mechanisms having various structures such as a window blind structure or a camera shutter.

The lithography system 100 may also include other techniques and components. For example, the lithography system may include components and mechanism to implement an immersion lithography process.

Referring to FIGS. 2a-2c, illustrated is a diagrammatic representation an exemplary embodiment of the illuminator 170 of FIG. 1, designated as illuminator 170a. The illuminator 170a includes a plate 210 being opaque to the radiation so that the radiation illuminating on the plate 210 will be blocked thereby from transmitting through. The plate 210 may be made of a metal, metal alloy, or other proper material. The plate 210 may include proper coating materials. The plate 210 may have a circular perimeter defining a center, 220, to be aligned with the optical axis during a lithography process.

The illuminator 170a further includes an extreme dipole with radiation-transmitting regions 230A and 230B. The extreme dipole is located on an axis of a first direction (referred to as X-axis). Alternatively the extreme dipole may be located on an axis of a second direction (referred to as Y-axis). The X-axis and Y-axis are perpendicular to each other. In the present embodiment, the radiation-transmitting regions, 230A and 230B, are located with respect to an x-dipole at angle of about θ. The outer and inner sigma values determine a position of the radiation-transmitting region from the center 220 (optical axis) relative to a radius of 1 unit. The inner sigma (r) corresponds to an inner portion of the radiation-transmitting region and the outer sigma (R) corresponds to an outer portion of the radiation-transmitting region. The transmitting regions 230A and 230B are defined along a radial axis perpendicular to the optical axis at a center 220 and equally distanced from the center 220. Each radiation-transmitting region may be made of a transparent or translucent material, an opening, or an opening covered with a transmitting material such as glass, liquid crystal, polarizers, or combinations thereof, to utilize an adjustable transmittance.

In the depicted embodiment, areas of both radiation-transmitting regions of 230A/230B may be asymmetric in X and Y directions. In order to describe the asymmetric characteristic in quantity, one of methods is using the following definitions of filling ratios and filling ration-offset of an illuminator, as described in further detail below.

A global filling ratio (GFR) of the illuminator 170a is defined as a total area of transmitting regions of 230A and 230B $[(\theta/\pi)*\pi(R^2-r^2)=\theta(R^2-r^2)]$ divides by a total area with a radius of 1 unit. The GFR of the illuminator 170a can be calculated by:

$$GFR=\theta(R^2-r^2)/\pi=(\theta/\pi)(R^2-r^2)$$

where θ is the dipole degree (referred to as dipole θ D), R is the sigma-out and r is the sigma-in of the radiation-transmitting region. As an example, for an illuminator with a dipole-120D, 0.85 of sigma-out (R) and 0.60 of sigma-in (r), the GFR is calculated by:

$$GFR=(120/180)(0.85^2-0.60^2)=0.24$$

An Y-Part filling ratio (YFR) of the illuminator 170a is defined as a total areas of 240A and 240B of transmitting regions in a region 250 where x<=y, divides by the area of the region 250 with a radius of 1 unit, as shown in FIG. 2b.

When $\theta$ is $>\pi/2$, the YFR of the illuminator 170a can be calculated by $$YFR=[2-(\pi/\theta)]GFR$$

where $\theta$ is the angle of the dipole. As an example, for an illuminator with a dipole-120D, 0.85 of sigma-out (R) and 0.60 of sigma-in (r), the YFR is calculated by $$YFR=\{2-\pi/[(2/3)\pi]\}*0.24=(1/2)*0.24=0.12$$

When $\theta$ is $<=\pi/2$, the YFR is zero

A X-Part filling ratio (XFR) of the illuminator 170a is defined as an area of transmitting region 250A (or 250B) in a region 260 where x>=y, divides by the area of the region 260 with a radius of 1 unit, as shown in FIG. 2c.

When $\theta$ is $>\pi/2$, the XFR of the illuminator 170a can be calculated by $$XFR=R^2-r^2$$

where R is sigma-out and r is sigma-in. As an example, for an illuminator with a dipole-120D, 0.85 of sigma-out (R) and 0.60 of sigma-in (r), the XFR is calculated by $$XFR=0.85^2-0.6^2=\mathbf{0.36}$$

The filling ratio offset (FRO) of the illuminator 170a (with the dipole located in X-axis) is defined by the difference between XFR and YFR. The FRO of the illuminator 170a can be calculated by $$FRO=XFR-YFR$$

As an example, for an illuminator with a dipole-120D, 0.85 of sigma-out (R) and 0.60 of sigma-in (r), the FRO is calculated by $$FRO=0.36-0.12=0.24$$

When $\theta$ is $<=\pi/2$, the XFR can be calculated by $$XFR=2GFR$$

Figure 3:
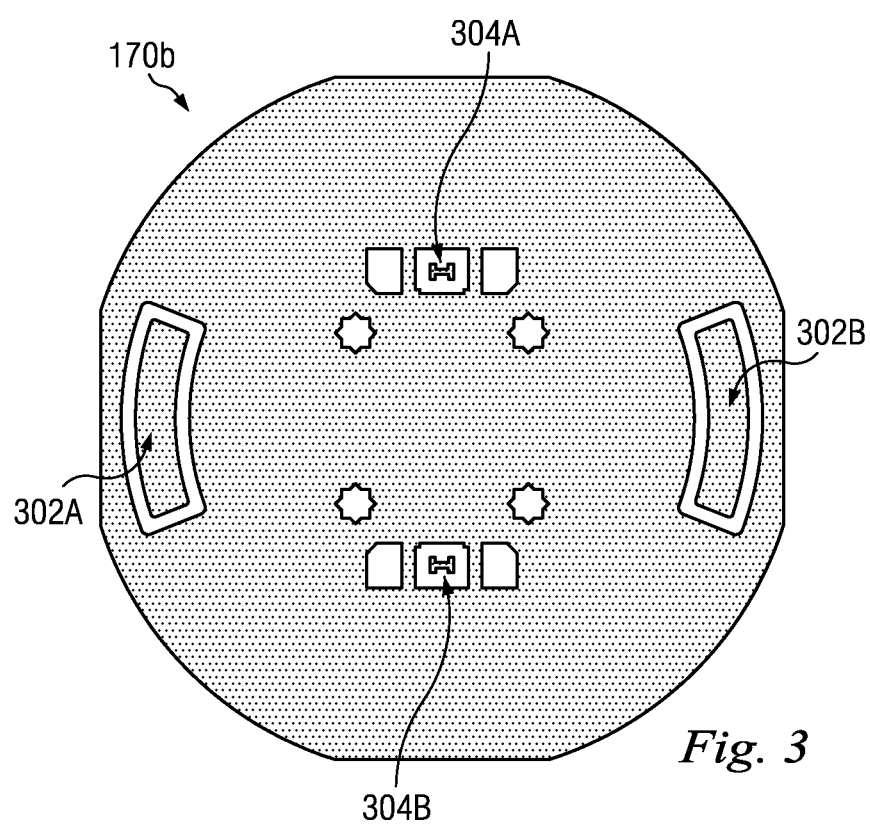
FIG. 3 is a side perspective view of another embodiment of an illuminator, which can be integrated into the lithography system of FIG. 1

Referring to FIG. 3, illustrated is yet another exemplary embodiment of an illuminator 170b that can be incorporated in the lithography system 100 of FIG. 1. The illuminator 170b is similar to the one illustrated in FIG. 2a, except for the differences discussed below. The illuminator 170b includes a first pair of radiation-transmitting regions 302A/302B and a second pair of radiation-transmitting regions 304A/304B. The first pair of radiation-transmitting regions 302A/302B are positioned in a diametrical axis (e.g., x-axis) and on opposite sides of the center optical axis defined along a perpendicular radial axis. The second pair of radiation-transmitting regions 304A and 304B are positioned in a diametrical axis perpendicular to the x-axis (e.g., y-axis). The radiation-transmitting regions 302A and 302B may be equally distanced from the center of the illuminator 170b. The radiation-transmitting regions 304A and 304B may be equally distanced from the center of the illuminator 170b. The first pair 302A and 302B are referred to as an extreme dipole corresponding to an outer sigma value and an inner sigma value. The second pair 304A and 304B are referred to as an ancillary dipole corresponding to another outer sigma value and another inner sigma value. The illuminator 170b may properly transfer images of both dense patterns and isolated patterns of a mask.

Alternatively, the illuminator 170 may include an extreme dipole with a first pair of radiation-transmitting regions and an ancillary dipole with a second pair of radiation-transmitting regions. Both the extreme dipole and the ancillary dipole are located on the x-axis. The extreme dipole has sigma values that are greater than the sigma values of the ancillary dipole. As an example, the extreme dipole has an outer sigma of about 0.83 and an inner sigma of about 0.73. The ancillary dipole has an outer sigma of about 0.30 and an inner sigma of about 0.22.

The first pair of radiation-transmitting regions 302A/302B may be covered by a first type of glasses with a first transmittance utilized by multilayer coating. The second pair of radiation-transmitting regions may be covered by a second type of glasses with a second transmittance. The first and the second transmittances are different in order to compensate for an angle-related CD error during a lithography exposing process. The glasses may be made of fused silica, calcium fluoride, or other suitable material, and coated with a material. The coating materials applied to the glass may include a metal film made with MoSi, ZrSiO, SiN, and/or TiN. The radiation-transmitting regions of the illuminator 170 may be defined in various shapes such as square, trapezoid, circular, or other proper shapes. The radiation-transmitting regions may be made of a transparent or translucent material, an opening, or an opening covered with a transmitting material such as glass, liquid crystal, polarizers, or combinations thereof, to utilize an adjustable transmittance.

The described illuminator 170b may be alternatively or additionally used for reducing patterning errors caused by other factors. In another example, each pair of glasses may additionally or alternatively have a different thickness such that a radiation wave phase through each pole may also be adjustable. In another example, a first pair of glasses and the second pair of glasses are substantially similar, each of the glasses being secured to a corresponding opening and having a mechanism of adjusting tilt angle. Thus configured with a mechanism of adjusting intensity, phase, polarization, or combinations thereof, the illuminator may be positioned such that two pairs of poles in orthogonal axes are aligned with orthogonal features (referred to as horizontal features and vertical features, respectively or X-Y oriented features) formed on a wafer. Both horizontal features and vertical features on a wafer may have a reduced angle-related CD error. Further, Horizontal features and vertical features may be substantially decoupled for independent adjustment. For example, vertical features may be determined by a horizontal pair of radiation-transmitting regions and horizontal features may be determined by a vertical pair of radiation-transmitting regions.

Figure 4:
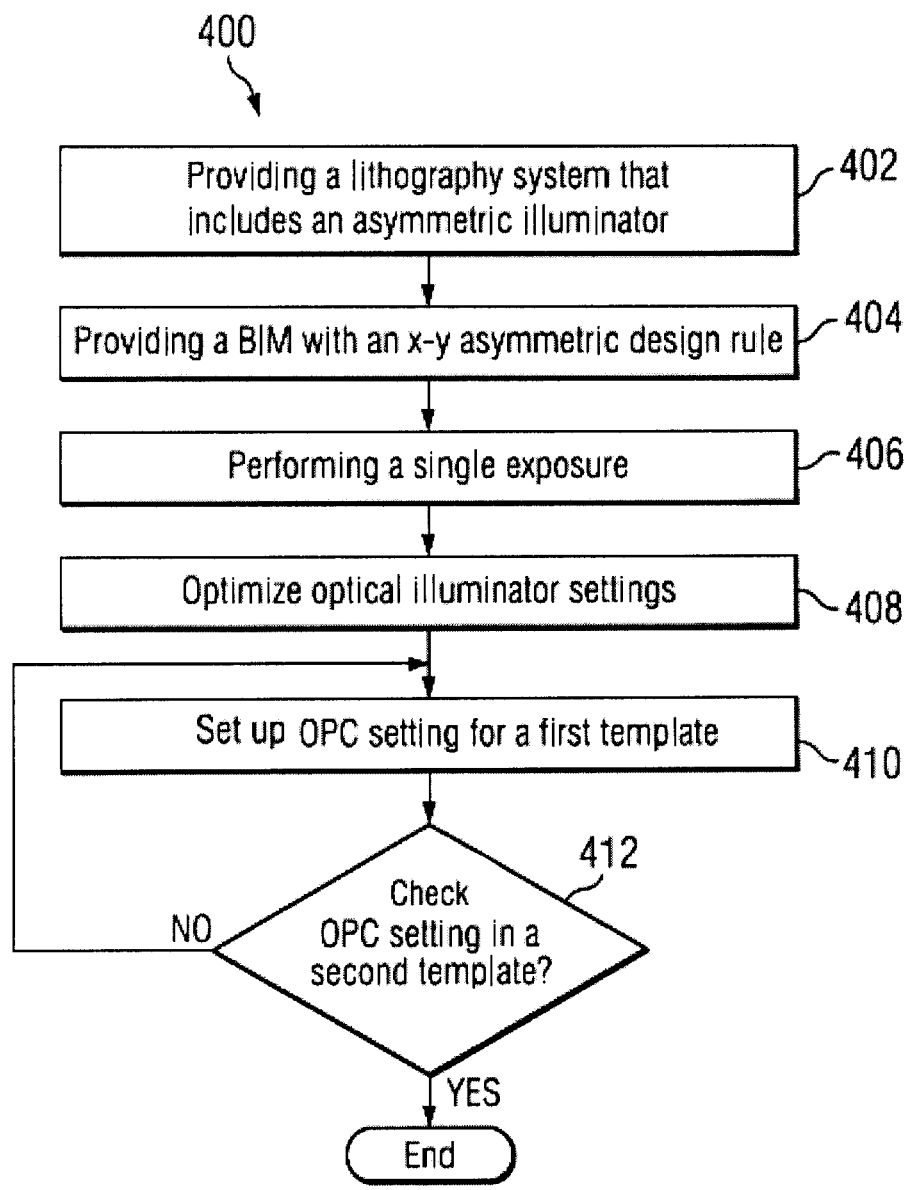
FIG. 4 is a flowchart of a method to implement convergence control using the lithography system of FIG. 1.

FIG. 4 illustrates a method 400 to implement compensation illumination in the lithography system 100 having a convergent and stable OPC control.

The method 400 begins at step 402. The lithography system 100 is provided and equipped with an X-Y asymmetric illuminator 170. The X-Y asymmetric illuminator 170 includes dipole, cross-pole, X-Y asymmetric Quasar, C-quad, or other suitable asymmetric illuminator. In the depicted embodiment, the filling rate offset (FRO) of the X-Y asymmetric illuminator 170 is larger than 3%.

The method 400 proceeds to step 404 by providing a binary intensity mask (BIM). Types of photomasks include phase shift mask (PSM) and BIM. A PSM includes an absorptive region and a transparent region (or a reflective region for EUV mask). A portion of an incident light transmits (or reflects) from the absorptive region with a proper phase difference with respect to transmitted (or reflected) light rays from the transparent region (or reflective region) to enhance the resolution and imaging quality. The absorber of the PSM can be made by materials, such as titanium nitride, tantalum nitride, tantalum and titanium. The PSM can be attenuated PSM (att. PSM) or alternating PSM (alt. PSM).

The BIM includes an absorptive region (also referred to as an opaque region) and a transparent region (or a reflective region for an EUV mask). In the opaque region, an absorber is present and an incident light beam is fully (or mostly) absorbed by the absorber. The absorber can be made by materials, such as chromium, chromium oxide, and aluminum-copper. In the transparent region (or the reflective region), the absorber is removed and the incident light is transmitted (or reflected) through (or by) a transparent substrate (e.g., fused quartz) or a multilayer minor (e.g., molybdenum-silicon). In the depicted embodiment, a less than 2% transmission rate in the opaque region is preferred.

In the present embodiment, the BIM employs X-Y asymmetric design rules of critical dimensions (CD) of patterns, in which CD of the X-direction of the pattern is substantially different to the CD of Y-direction, such as around 20%.

The method 400 proceeds to step 406 by performing a single exposure by the lithography system 100 to transfer an image having both a dense pattern and an isolated pattern onto the target substrate 160.

The method 400 proceeds to step 408 by optimizing optical settings of the X-Y asymmetric illuminator 170 for the lithography system based, at least in part, on one or more of a numerical aperture, sigma-in, sigma-out, wave phase and polarization for the mask with defined gate pitches in a first direction for the good performance indexes, such as small MEEF, good CD uniformity, and large depth of focus (DOF).

The method 400 proceeds to step 410 by setting OPC correctors for the first template. The OPC correctors are designed for adding assistant features to and modifying the IC design layout to enhance optical resolution. Various OPC features, such as scattering bars, serif, and/or hammerheads, are added to the IC design layout. Other OPC features (and/or bias) may also (or alternatively) be added or repositioned according to an optical model or rules such that, after a lithography process, a final pattern on a wafer is improved with enhanced resolution and precision.

A first setting of OPC correctors is chosen to achieve convergent and stable correction results with a target of a relatively small edge placement error (EPE) and MEEF of the defined gate pitch in the first template. As an example, the first OPC setting produces about 1.0 nm of EPE and about 1.1 of MEEF for a 117 nm gate pitch in the X direction in the first template.

The method 400 proceeds to step 412 by checking the first OPC setting in a second template. The second template is adjacent to the first template. The first OPC setting is checked for its consistency in the similar dimensions of mask (DOM) in the second, adjacent templates. It is also checked to see if the EPE and MEEF of the similar DOM in the second templates stay within the predetermined range, substantially similar with those in the first template.

If the first OPC setting achieves a convergent result in the second template, the method 400 proceeds into a Y route to end the process. For example, the first OPC setting achieves 1 nm of EPE and 1.1 of MEEF for a 117 nm gate pitch in the second template. If the first OPC setting does not achieve a convergent results with a target EPE and MEEF in the second template, the method 400 proceeds into a N route to go back to step 410 to chose a second OPC setting and repeat step 410 and 420.

In OPC iterations, it is desired to achieve convergent and stable OPC results for the similar DOM in the adjacent templates (or patches) with less OPC runtime, to maintain an adequate EPE when changing optical illuminator, improve CD uniformity and overall process window and improve OPC consistence in both of the first and the second, adjacent template. Based on the discussions above, it can be seen that the present disclosure offers the method 400 to achieve an OPC convergence and stable control by employing a single exposure, a X-Y asymmetric design rules, a X-Y asymmetric illuminators with a larger than 3% FRO between X and Y directions and a mask with a less than 2% transmission rate in dark field areas. The method 400 has been observed to achieve a good OPC convergence, a consistent OPC correction result, and a good MEEF and EPE in both of the first and the second templates within an adequate OPC runtime.

Figure 5:
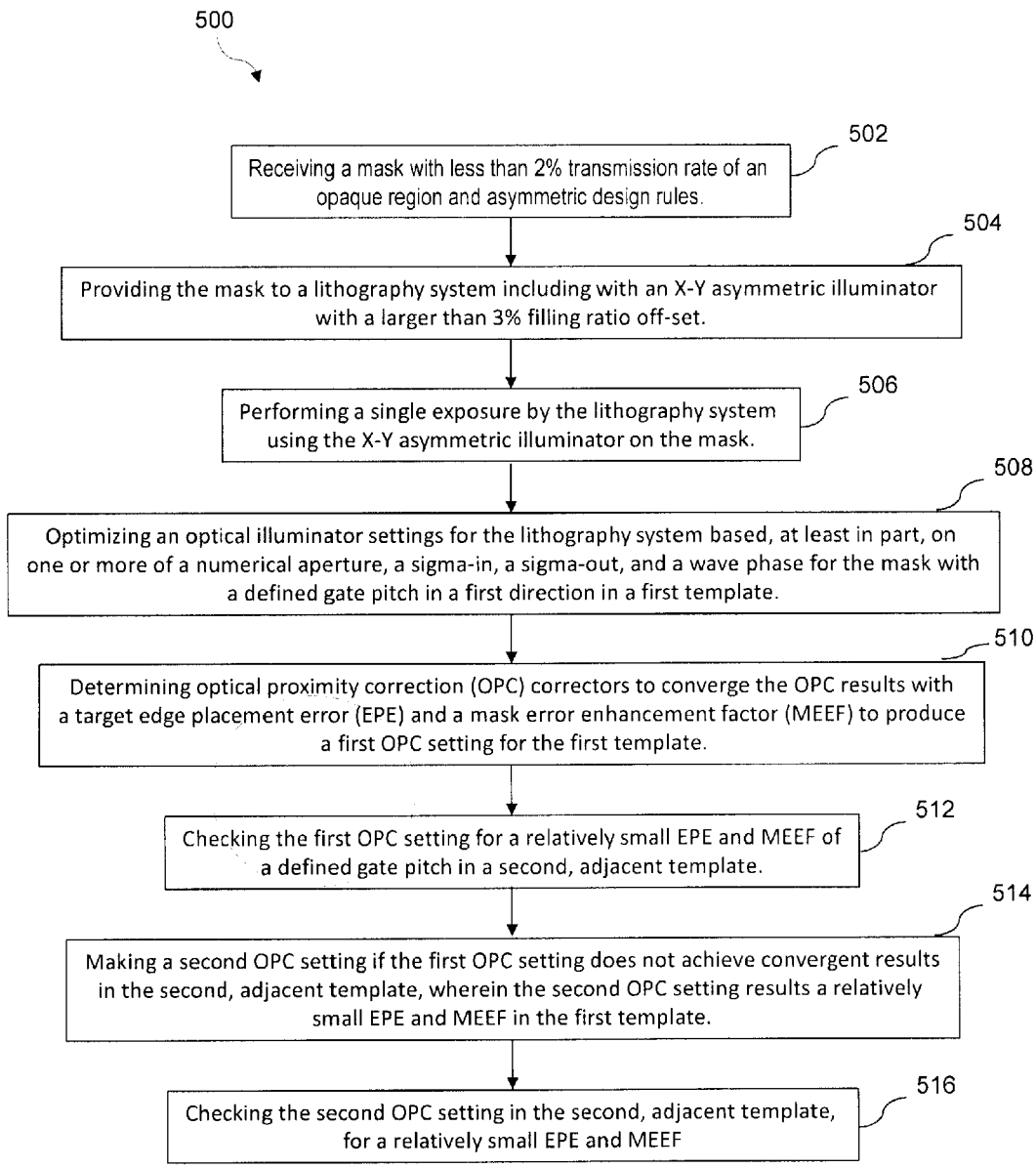
FIG. 5 is a flowchart of another method to implement convergence control using the lithography system of FIG. 1.

FIG. 5 is a flowchart of another method 500 to implement convergence control using the lithography system of FIG. 1. Method 500 begins at step 502 by receiving a mask with less than 2% transmission rate of an opaque region and asymmetric design rules. Method 500 continues at step 504 by providing the mask to a lithography system including with an X-Y asymmetric illuminator with a larger than 3% filling ratio off-set. Next, at step 506, method 500 continues with performing a single exposure by the lithography system using the X-Y asymmetric illuminator on the mask. Additionally, method 500 continues at step 508 by optimizing an optical illuminator settings for the lithography system based, at least in part, on one or more of a numerical aperture, a sigma-in, a sigma-out, and a wave phase for the mask with a defined gate pitch in a first direction in a first template. Method 500 continues at step 510 by determining optical proximity correction (UPC) correctors to converge the OPC results with a target edge placement error (EPE) and a mask error enhancement factor (MEEF) to produce a first OPC setting for the first template. Next, method 500 continues at step 512 by checking the first OPC setting for a relatively small EPE, and MEEF of a defined gate pitch in a second, adjacent template. At step 514, method 500 continues by making a second OPC setting if the first OPC setting does not achieve convergent results in the second, adjacent template, wherein the second OPC setting results a relatively small EPE and MEEF in the first template. Method 500, at step 516, includes checking the second OPC setting in the second, adjacent template, for a relatively small EPE and MEEF.

The present disclosure has been described relative to various embodiments. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:
1. A method for use in a lithography system including an optical illuminator with first and second templates, wherein the first and second templates are adjacent to each other, the method comprising:
performing an exposure by the illuminator on a photomask;

optimizing an optical illuminator setting based, at least in part, on one or more of a numerical aperture, a sigma-in, a sigma-out, and a wave phase for the photomask with a defined gate pitch in a first direction in the first template;

determining optical proximity correction (OPC) results for the photomask;

determining OPC correctors to converge the OPC results with a target edge placement error (EPE) and a mask error enhancement factor (MEEF) to produce a first OPC setting for the first template, wherein the first OPC setting targets a relatively small EPE and MEEF of the defined gate pitch in the first template;

checking the first OPC setting for a relatively small EPE and a relatively small MEEF of the defined gate pitch in the second template, wherein the photomask employs X-Y asymmetric design rules.

2. The method of claim 1, wherein the exposure is a single exposure.

3. The method of claim 1, wherein the illuminator is asymmetric.

4. The method of claim 3, wherein a filling ratio offset of the illuminator between the first direction and the second direction is equal to or larger than about 3%.

5. The method of claim 1, wherein the illuminator includes a dipole.

6. The method of claim 1, wherein the photomask is formed to have binary intensity characteristic with a plurality of opaque and transmitting regions.

7. The method of claim 6, wherein a transmission rate of the opaque regions is equal to or less than about 2%.

8. The method of claim 6, wherein the photomask is a binary intensity mask (BIM).

9. The method of claim 1, wherein a critical dimension (CD) difference of features between an X-direction and a Y-direction is larger than 10%.

10. The method of claim 1, wherein the OPC settings produce convergence results in both of the first template and the second template.

11. The method of claim 1, wherein the OPC settings produce substantially similar EPE in both of the first and second templates.

12. The method of claim 1, wherein the OPC settings produce substantially similar MEEF in both of the first and second templates.

13. A method for use in a lithography system including a mask with a less than 2% transmission rate of the opaque region and an X-Y asymmetric illuminator with a larger than 3% filling ratio off-set (FRO), comprising:

performing a single exposure by the X-Y asymmetric illuminator on the mask;

optimizing an optical illuminator settings for the lithography system based, at least in part, on one or more of a numerical aperture, a sigma-in, a sigma-out, and a wave phase for the mask with a defined gate pitch in a first direction in a first template of the X-Y asymmetric illuminator;

determining optical proximity correction (OPC) results for the mask;

determining OPC correctors to converge the OPC results with a target edge placement error (EPE) and a mask error enhancement factor (MEEF) to produce a first OPC setting for the first template, wherein the first OPC setting targets a relatively small EPE and MEEF of a defined gate pitch in the first template;

checking the first OPC setting for a relatively small EPE and MEEF of the defined gate pitch in a second template of the X-Y asymmetric illuminator, wherein the first template and the second template are adjacent to each other.

14. The method of claim 13, wherein the X-Y asymmetric illuminator is selected from the group consisting of a Dipole asymmetric illuminator, a Quasar asymmetric illuminator and a C-quad asymmetric illuminator.

15. The method of claim 13, wherein the first OPC settings produce a convergence result for a 117 nm gate pitch in both the first template and the second template.

16. The method of claim 13, wherein the first OPC settings produce an EPE equal to or smaller than about 1.0 nm for a 117 nm gate pitch in both the first template and the second template.

17. The method of claim 13, wherein the first OPC settings produce a MEEF convergence equal to or smaller than about 1.1 for a 117 nm gate pitch in both the first template and the second template.

18. The method of claim 13, wherein the mask employs asymmetric design rules.

19. A method for use in a lithography system, the method comprising:

receiving a mask with less than 2% transmission rate of an opaque region and asymmetric design rules;

providing the mask to the lithography system that includes an X-Y asymmetric illuminator with a larger than 3% filling ratio off-set;

performing a single exposure by the X-Y asymmetric illuminator on the mask;

optimizing an optical illuminator settings for the lithography system based, at least in part, on one or more of a numerical aperture, a sigma-in, a sigma-out, and a wave phase for the mask with a defined gate pitch in a first direction in a first template;

determining optical proximity correction (OPC) correctors to converge the OPC results with a target edge placement error (EPE) and a mask error enhancement factor (MEEF) to produce a first OPC setting for the first template;

checking the first OPC setting for a relatively small EPE and MEEF of a defined gate pitch in a second, adjacent template;

making a second OPC setting if the first OPC setting does not achieve convergent results in the second template, wherein the first template and the second template are adjacent to each other.

20. The method of claim 19, wherein the X-Y asymmetric illuminator is selected from the group consisting of a Dipole asymmetric illuminator, a Quasar asymmetric illuminator and a C-quad asymmetric illuminator.

* * * * *